United States Patent [19]

Rollwitz et al.

[11] Patent Number: 4,531,093

[45] Date of Patent: Jul. 23, 1985

[54] METHOD AND APPARATUS FOR COAL ANALYSIS AND FLOW MEASUREMENT

[75] Inventors: William L. Rollwitz; James D. King, both of San Antonio, Tex.

[73] Assignee: Southwest Research Institute, San Antonio, Tex.

[21] Appl. No.: 491,869

[22] Filed: May 5, 1983

[51] Int. Cl.³ .............................................. G01R 33/08
[52] U.S. Cl. ..................................... 324/300; 324/306
[58] Field of Search ............... 324/300, 306, 309, 315, 324/316, 318, 224, 244, 248; 436/173

[56] References Cited

U.S. PATENT DOCUMENTS 3,473,108 10/1969 McCormick ......................... 324/306
4,390,957 6/1983 Skarios ................................ 324/300

Primary Examiner—Michael J. Tokar
Attorney, Agent, or Firm—Gunn, Lee & Jackson

[57] ABSTRACT

A flow meter apparatus and method for measuring the flow, composition and heat content of coal is set forth. In the preferred and illustrated embodiment, the free or unpaired electron population of flowing coal is measured by electron magnetic resonance (EMR); the hydrogen nucleii population is measured by nuclear magnetic resonance (NMR). By calibration utilizing a standard specimen for a given type of coal, a profile for various types of coal can be obtained wherein measurement data is converted into an indication of the heat content typically measured in BTU per pound. This enables provision of a volumetric flow meter, a flow meter indicating flow in calorie content. This device enables integration to provide total heat content flow. Other variables describing the coal can be obtained.

45 Claims, 1 Drawing Figure

METHOD AND APPARATUS FOR COAL ANALYSIS AND FLOW MEASUREMENT

BACKGROUND OF THE DISCLOSURE

This invention was made under United States Government Contract No. DE-AC01-79ET15465 and the United States Government has a nonexclusive, nontransferable, irrevocable, paid-up license to practice or have practiced for or on behalf of the United States, this invention throughout the world.

This disclosure is directed to a method and apparatus for determining the heat flow in a coal slurry or other coal conduit. This apparatus particularly applies to a a pipeline delivering ground coal in water, air or other carrier. Other conduit arrangements are permissible and can be measured through the use of the present apparatus including a slurry pipeline delivering coal of relatively large particle size in water. Another type of coal conduit is a conveyor system wherein coal particles are carried in a trough or on a conveyor belt. Whatever the case, the present invention is particularly adapted to measure the flow of coal. This flow can be indicated in weight, as for instance pounds or kilograms. Even better, the flow of coal can be indicated in heat content such as BTUs per pound or calories per kilogram, or it can be converted into a flow of BTUs or calories per unit time. Other data which can be obtained is the flow velocity, flow density, mass flow rate, percentage of moisture in the coal, percentage of hydrogen, and percentage of carbon in the combustible portions of the coal.

This apparatus and method provide coal flow data in real time when positioned adjacent to a stream of flowing coal. The coal is typically carried on a conveyor system or is delivered through a pipe, either by carrying the coal or conducting the flow of coal in water, air or other fluid. Real time data of the flow rate is provided, thereby avoiding the necessity of waiting for long intervals to obtain composition data and moisture determination. Moreover, discrete sampling and analysis with various analytical devices is not required to avoid lengthy laboratory test procedures. Rather, the data describing the combustible portion of the coal is delivered in real time to enable optimum combustion to occur in a plant which is stoked with coal. Consider as an example a large scale steam plant where coal is burned around the clock. Should the combusted coal vary in heat content, the steam output will vary. It is necessary to compensate for this variation. One way to compensate is to vent excess steam when it is made. However, this is wasteful. Another method of compensation is to bank the furnace. This also is wasteful and somewhat slow. It is better to sustain a controlled fuel input to the furnace for a controlled steam output. The present apparatus particularly enables the coal to be delivered at a faster or slower rate to thereby modify the heat input to overcome vagaries in coal quality and plant operation. If the heat content varies over a period of time, the rate of delivery of coal can be varied. Such control requires instanteous reading that the heat content of the coal delivered to the furnace has changed.

An important feature of this apparatus and method is the fact that data is obtained without taking discrete samples or invading the flow path. No samples are required. Moreover, the flow path is not intercepted by the apparatus. Rather, the flow path remains unaltered and hence there is no chance for snagging or hanging up on the flow path. Indeed, the data which is obtained from the flowing coal in the flow path is obtained substantially without invasion. Magnetic and electro-magnetic fields are impressed in the flow path, but this certainly does not impede the flow path.

This apparatus and method cooperate quite well with coal which is ground to a relatively fine mesh. It will also operate quite well with coal in larger particles. This avoids the necessity of pulverizing the coal merely to obtain test data.

It has been discovered that magnetic fields of specified intensity can be imposed on a non-metallic product pipe. This exposes the flowing coal to a steady magnetic field and also to a radio frequency magnetic field. The interplay between the magnetic field and the radio frequency magnetic field initiates the type of response which is obtained by forming data signals to encode concentrations of hydrogen and unpaired electrons for subsequent processing.

This apparatus utilizes electron magnetic resonance. It also uses nuclear magnetic resonance. It has been determined that electron magnetic resonance (EMR) is particularly useful for measurements relating to coal because coal contains relatively significant concentrations of free or unpaired electrons. Coal is primarily a hydrocarbon. The carbon molecules in the coal have a relatively high population of unpaired electrons which permits a signal to be formed relating to the carbon population in the material. Separate from this, nuclear magnetic resonance (NMR) is used to determine the hydrogen bearing constituents in the coal. Three hydrogen responses are obtained. One NMR response provides an indication of hydrogen in the water within the coal. This water is to be distinguished from water (a second NMR response) which is used as a slurry pipeline transport fluid. Another response is obtained from the hydrogen in the volatile components of the coal. Since the source of the coal is usually known, a profile of the coal can be initially determined indicative of the relative ratios of hydrogen and carbon in the coal. Nonresponsive chemical compounds including the ash components can also be determined from this profile. Accordingly, these measurements which indicate relative concentrations of hydrogen in the volatile components of the coal and carbon enable the BTU flow to be determined.

In general terms, the two types of measurements described herein are somewhat akin in nature. NMR senses the nuclei of a selected elemental species within the specimen. EMR senses the free electrons within the material. Both require that the specimen of interest be exposed to a relatively static magnetic field. Detection in both instances is achieved by sensing the interaction of the applied magnetic field and the magnetic moment of the particles of interest, the free electrons in the case of EMR and the hydrogen nuceli in the case of NMR. The interaction between the applied field and the magnetic moment of the subatomic particle of interest causes a change in the absorbed energy from the applied radio frequency magnetic field, the absorbed energy being thereafter emitted. The energy which is emitted after absorption creates an output signal or echo which can be detected. This output signal is proportional to the population of the subatomic nuclei or free electrons of interest.

It has been discovered that the frequency of the applied electromagnetic field should coincide with the resonant frequency of particles in the field. The resonant frequency is proportional to the intensity of the magnetic field. For electrons, the resonant frequency is given by Equation (1):

$$f_O = 2.7994 \, H_O \tag{1}$$

In the foregoing relationship, the resonant frequency is given in megahertz and the magnetic field intensity is measured in Gauss. This is the relationship that prevails for free electrons and hence is the relationship to be achieved to obtain EMR measurements.

To obtain NMR measurements, the resonant frequency is given by Equation (2):

$$f_O = M \times H_O \tag{2}$$

In the foregoing equation the proportionality constant M is different for the particular nuclear species of interest.

It must be assumed that any target has several nuclei which might be of interest. By adjustment of the magnetic field intensity, hydrogen nuclei only can be detected. In other words, a signal is obtained by NMR response only from the hydrogen nuclei within the mass of material exposed to the fields required to initiate NMR, and the measure of the hydrogen constituents in the coal can then be obtained. For hydrogen nuclei (essentially a proton only), the resonant frequency is given by Equation (3):

$$f_O = 4.2577 \times H_O \tag{3}$$

in kilohertz when $H_O$ is in Gauss.

· On review of Equations (1) and (3) above, it will be observed that magnetic field intensity is generally the variable of interest. When magnetic field intensity is increased, the sensitivity of both NMR and EMR responses is increased. As an example, signals of suitable size for easy handling has been obtained at a frequency of about 10 megahertz by subjecting the specimen to a field of 2346 Gauss. A suitable EMR response at a frequency of about 2 gigahertz has been obtained in response to a field of 714 Gauss. Obviously, if the scale factors increase by a substantial factor (two or three orders of magnitude), a suitable NMR frequency can be obtained such as 2.5 megahertz from a magnetic field of 587 Gauss. Utilizing field intensity as a scale factor, the requirements of the magnet are relatively modest and practical. While much higher field intensities can be obtained in laboratory circumstances, it is one feature of this invention to provide a system which can be installed in the field and left untended for long periods of time. This is achieved by the use of relatively low intensity magnetic fields.

One of the important features of this disclosure is the ability to analyze the hydrogen response to the NMR interrogation and obtain separate data including at least three components. That is, three components of the NMR signal are obtained indicative of hydrogen. One hydrogen is in free water or other liquids that may be present in the coal. That may be the medium which carries the coal slurry. It is not particularly important in terms of heat content. Another component is the bound water present. This is water tied up in the matrix of the coal. A third component is the hydrogen which is chemically bound in the volatile portion of the coal. By sorting out the three constituent parts of the hydrogen signal, substantial data from the NMR measurements can be obtained including an indication of total moisture (referring to moisture in the coal) and the hydrogen in the volatiles and hence, quantification of the total flow of coal.

An advantage of this disclosure is the ability to determine flow of the coal in the slurry pipeline. The flow of the coal is measured through NMR and EMR interrogation. The magnitude of the NMR and EMR signals are constantly reviewed to provide a continuous measure of density. A separate measure is obtained of velocity. Given both velocity and density, total mass flow can then be obtained. This enables the total mass of constituents detected by NMR or EMR to be determined. Since the mass can be determined per unit time and the relative population of carbon and hydrogen within the mass is also determined, the BTU content is determined. The BTU content is determined by measuring the NMR and EMR responses to determine the presence of carbon and hydrogen, comparing this data with the profile for the type of coal passing through the slurry line.

Coal samples have been checked to determine various parameters of different types of coal. On examination of a number of different coals from various parts of the United States, profiles have been obtained of the various types of coal including the calorific value and the relative percentages of carbon, ash, moisture, and volatile components. Over twenty types of coals have been tested. In part, the test was verification of NMR and EMR responses. The various types of coal include compounds which do not respond to NMR and EMR interrogation as contemplated by this invention. As an example, sulfur and other constituents generally comprising the ash content are known to be present, but they are not significant in contributing to the BTU content. Ash constituents do not particularly impact the data obtained by this invention. Accordingly, correlation between the EMR and NMR signals and the parameters of the coal have been determined and related to the various coal properties including ash content. Determining such coefficients by testing multiple batches of various types of the coals, the accuracy of the coal parameters has been reasonably determined. As will be set forth in table one below, such parameters are tabulated listing from the maximum calorific content to minimum heat content. Other parameters can be determined as desired; sulfur and other elements present (even though not measured) do not alter the BTU value, and indeed, such elements can be estimated pro rata according to the type of coal flowing in the system.

It is helpful to define the nature of the signal which is obtained from EMR interrogation. Coal fortunately has a substantial population of unpaired electrons to provide relatively strong and stable signals. The EMR data is preferably defined as the total relative EMR signal, or the product of EMR signal amplitude multiplied by line width. The product of amplitude and line width represents the total energy absorption. Accordingly, maximum amplitude and total energy absorption are useful measures of the carbon content of the coal.

Similarly, the NMR signal response should be considered. For definitional purposes, the spin-lattice relaxation time constant is $T_1$. For most coals, it ranges from about 0.001 to about 0.040 seconds. The spin-spin relaxation time is $T_2$. It typically is about 40 microseconds or less. $T_2$ is noted in three ranges, one for the bound water, one for the free water and one for the hydrogen in the volatile portion. The relaxation times $T_1$ and $T_2$ are indicative of the type of coal flowing in the pipeline. Moreover, the NMR response amplitude fairly well suggests a relative ratio of hydrogen in the coal (sorting out water by $T_2$ discrimination). Since there is a carbon EMR signal, a ratio of hydrogen to carbon with relatively crude weighting coefficients determined for the various types of coals (including the one that happens to be flowing in the slurry line) enables relatively accurate calculation of the calorific value of the flowing coal to a fairly high accuracy, perhaps within 200 BTU. Accuracy can be improved by obtaining better correlation for the type of coal including adjustments for the known values of sulfur and oxygen in the coal, these elements altering the BTU content. Such alterations are relatively minor.

Many other advantages to the present invention are worth noting. It is particularly suited for installation for real time analysis of a continual flow of coal in a coal slurry line or the like, and is able to provide continual data evaluating the coal flowing or stationary. The precise nature of the evaluation can be varied to include BTU per pound, percentage moisture, percentage hydrogen, percentage carbon, flow density and other variables as determined. With this in view, this apparatus is summarized as a coal flow measuring system capable of measuring coal flowing past a point at which the equipment is installed and indicating in real time the nature of the flow and measuring that flow. The device tests the coal for carbon population in response to EMR interrogation. Hydrogen is determined by NMR interrogation sorting out hydrogen of water by $T_2$ discrimination. The signals are evaluated, and the total flow of coal is obtained from a linear equation indicating total calorific flow or mass depending on constants in the equation, as a function of these two measures. Separately, the NMR response is broken down to isolate hydrogen in the volatile components and hydrogen of water.

These and other advantages of the present invention will be more readily apparent upon a consideration of the below written description of the preferred embodiment, that being correlated to the drawings included with this disclosure.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
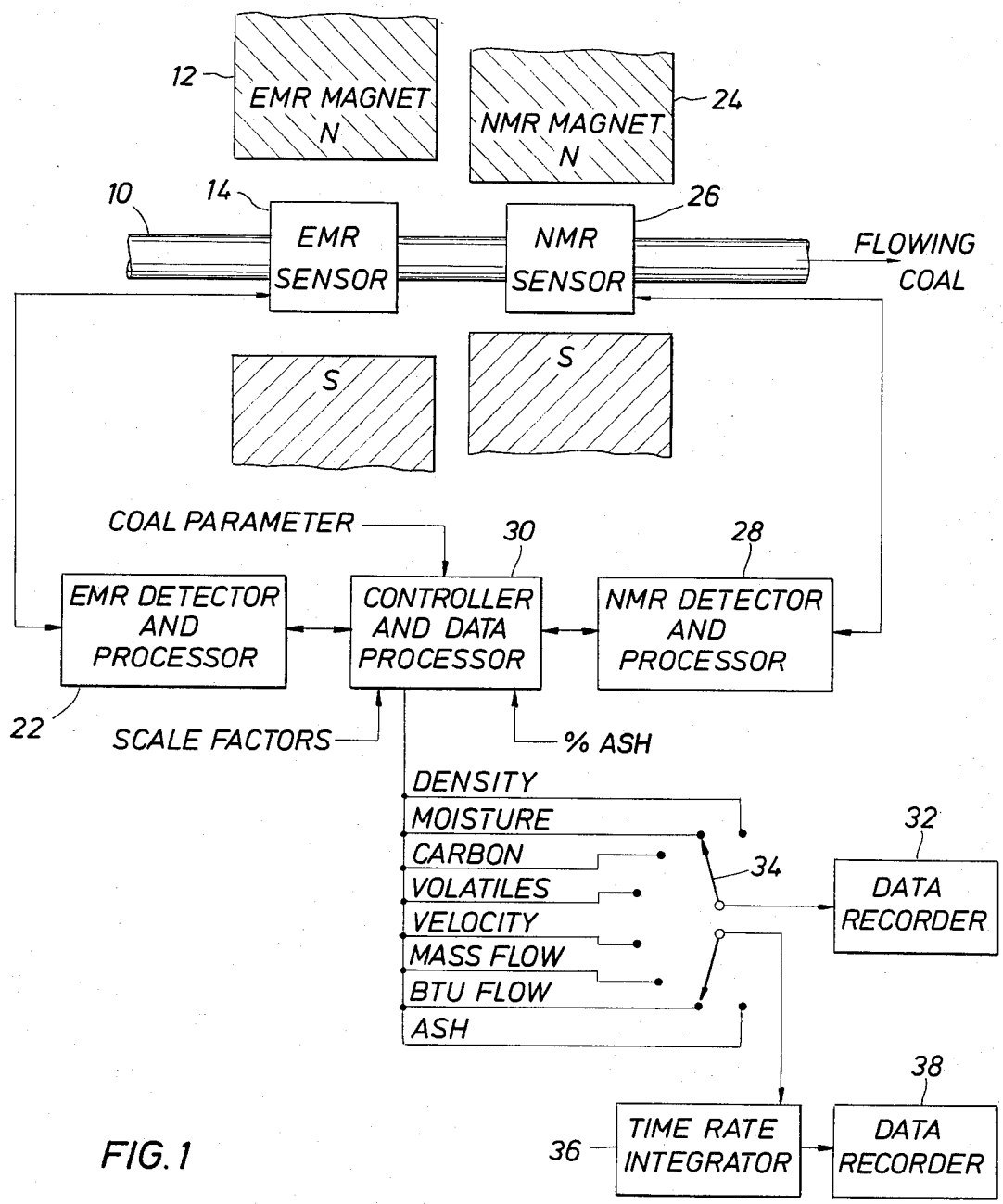
FIG. 1 is a schematic block diagram of the present apparatus showing a coal line positioned adjacent to magnetics and sensors for obtaining data from the flowing coal.

Attention is first directed to FIG. 1 of the drawings. There, the numeral 10 identifies a coal slurry line. It carries granulated or particle coal flowing in water, air or other fluid. Other types of lines can be used. For instance, the coal may be ground to fine dust or may be larger particles flowing in water, or without water. It can flow in a conduit such as a pipeline of suitable diameter. Alternatively, it can be flowing on a rubber conveyor or in a moving trough. The variety of arrangements is not limited by the precise deployment of a round pipe conducting coal flow in water.

The coal passes through an EMR magnet 12. The magnet is located on the outside of the pipeline. To this end, the pipe, at least adjacent to the magnet 12, must be formed of a non-magnetic material. Low pressures are normally encountered and hence, plastic pipe will suffice. A first magnetic field is formed. The first magnetic field impinges on the coal which is flowing through the pipeline 10. A relatively uniform field is formed at a field intensity to be discussed below. The uniform field acts on a significant length of the pipe, thereby assuring that the carbon in the coal is interrogated to obtain an EMR response. An EMR sensor is also included and identified at 14. Briefly, a static magnetic field is applied by the magnet 12. A high frequency signal is applied to the flowing material in the pipeline. The RF field is at right angles. That is, the field that is applied by the sensor 14 is at right angles to the magnetic field. One technique to accomplish this is to place a coil around the pipe 10 and form RF fields within the coil coaxially with pipe 10. Another approach is to position a high frequency signal generator such as a klystron at a position that the field formed by the klystron and associated wave guides is perpendicular to the magnetic field. In any case, such a field is formed at right angles.

The sensor 14 shown in FIG. 1 responds to this sample EMR signal. The EMR sensor includes a coil serving both as a transmitter and receiver. It is a transmitter of the applied RF field impinging on the material sample, and it is a receiver for the return EMR signal. The EMR output signal is formed by the sensor and is connected to the detector and processor 22 shown in FIG. 1. Typically, the output signal at the detector 22 has a relative amplitude and width, and the output includes both aspects. That is, the output signal from the detector 22 includes both EMR amplitude and line width data.

FIG. 1 further includes a second magnet identified by the numeral 24. It forms a separate magnetic field for the coal flowing in the conduit or pipe 10. It cooperates with a NMR sensor 26. Magnetic lines are formed between the magnet pole pieces. They are perpendicular to the RF field applied by the NMR sensor. This field and frequency are related to one another by Equation (3) above. Typically, the frequency is in the range of a few to several tens of megahertz. Typically, the magnetic field is in the range of up to perhaps 1,000 or 2,000 Gauss. The NMR response is encoded as a RF signal which is detected by the NMR sensor 26. That sensor is input to the NMR detector and processor 28. This forms a signal which is input to the controller and data processor 30. The data processor 30 receives signals from both detectors 22 and 28. EMR data is indicative of free electron population and hence is proportionate to carbon content. The NMR signal, previously described, provides an indication of hydrogen content, and the hydrogen content is broken into three different signals which are free water, bound water or moisture within the coal and hydrogen in the volatile compounds of the coal which are combusted.

Parameters of the coal in question are input to the data processor 30. Table one sets forth certain parameters. These have been determined by test and observation, and they describe different types of coal. For a given type of coal, such data indicates a profile of the parameters which describe the particular type of coal. These parameters are used as scale factors to calibrate the response from the NMR and EMR observations so that the device can be calibrated. For instance, a profile of a particular type of coal is obtained. The EMR and NMR signals obtained then identify the specified flowing coal. The signals are calibrated against the standard, thereby enabling the system to be fully calibrated for different concentrations of the selected coals.

Continuing on, data is presented to a data recorder 32 by means of a selector 34. The various outputs from the data processor are obtained by weighting the input signals. For instance, one weighted signal in terms of output in BTU or calories in static conditions for cool in the sensor is given by Equation (4):

$$Q = (A \times H) + (B \times C) + D \quad (4)$$

where
Q = BTUs or calories;
A, B, and D = are constants;
H = the amplitude of the NMR component from hydrogen in the coal volatiles; and
C = the EMR signal amplitude times signal line width.

Other equations resembling this equation can be utilized to obtain other outputs such as weight. It will further observed that the time rate integrator 36 is selectively connected to various outputs and to a data recorder 38 to record the integral of the flow either in mass or BTU over a specified time interval.

As mentioned above, the NMR component derives from hydrogen; hydrogen is in three separate forms, one being the hydrogen bound in the volatile constituents of the coal, another being bound water and the third being free water. All three hydrogen nuclei give different $T_2$ responses. Accordingly, Equation (4) above utilizes the hydrogen response from the bound hydrogen in the coal, and not the water associated hydrogen. The water can be measured readily because the $T_2$ response for the hydrogen involved in the volatile compounds of the coal is within a range that is different from the range of the $T_2$ response for water, free or bound.

Table 1 below lists certain data for samples. This data is representative of the type of data which can be obtained by assay of coal. The table sets forth particular types of coal from different locales.

Table 2 is a representative set of data for an arbitrary set of samples. First of all, Table 2 lists the EMR response (normalized to 100 arbitrary units) for the sample number 10. Recall from Equation (4) that this EMR signal is in actuality the area under the curve approximated by the amplitude of the EMR signal multiplied by the line width. This curve more or less approximates a Gaussian shape. This data yields an approximate count of free electrons; the free electrons are proportional to the carbon content of the coal. It will be recalled that the coal is comprised of carbon available for combustion and other constituents which do not contribute to heat liberation. The EMR signal listed in Table 2 for selected samples thus encodes the carbon count for the sample.

In Table 2, the NMR response has also been normalized for a maximum quantity of the first sample listed in the table. The NMR response is the free induction decay signal. Table 2 further includes in arbitrary time units $T_2$, the first entry being a column for the hydrogen bound in volatile constituents with the coal. There, the value of $T_2$ is the stated value or smaller while the second value of $T_2$ is that maximum value which will be observed for water. It may be less. Again, the entries for $T_2$ of the hydrogen are scaled in arbitrary units.

Going back to Equation (4), this equation sets out heat content either in BTUs or calories. The constants can be varied to encompass changes in scale factor. The conditions under which this equation is successfully used should be noted.

First of all, the space of the magnetic polarization and RF interrogation (for both the EMR and NMR responses) is assumed to be physically fixed; that is, the pipe is fixed in volume relative to the test equipment. It is further assumed that the pipe or conveyor belt is sufficiently full that, the EMR and NMR signals are not so weak as to be seriously degraded by apparatus noise. The device works quite well (after calibration) with or without a relatively full sample volume. This volume is limited by the pipe or conveyor system, but the amount of coal is measured by use of the NMR and EMR signal amplitudes and a full pipe is not necessary for proper operation of the apparatus.

The pipe or conveyor typically conducts coal flowing past the test apparatus at a specified rate. This rate of movement is quite slow in contrast with the speed of the test procedure described herein. Accordingly, there is no volumetric factor included in Equation (4). This is because the test is substantially instantaneous. Even should the test be repeated, the relative movement of the flowing coal is so small (in contrast with the elapsed time required to complete testing) that the test can be deemed to be instantaneous. There is no velocity factor in Equation (4). Equation (4) can be deemed to be successful for both static and dynamic coal measuring systems. Dynamic refers to a system where the coal is flowing past the test equipment at flow rates typically encountered in commercial applications; even so, that flow rate is still sufficiently small that the coal undergoing testing is static or stationary for practical purposes. In this light, the equipment is principally switched off most of the time, even when controlling the rate of flow of coal in a large plant.

Assume as an example that the coils which surround the pipe are sized to permit air blown particulate coal moving therepast in a six inch ID pipe. Assume further that the pipe is connected from a supply source of coal ground to smaller particles, including particles ground as finely as 220 mesh and also particles of much larger size. Assume further that the flow is continuous with sufficient air percolating through the coal to move it from the supply toward the furnace. Assume further that the pipe is substantially full. Even so, there is a decrease in fill factor resulting from the percolation of air (or any other driving fluid) through the coal, but since the amplitude of the NMR and EMR signals are proportional to the density of the coal in the sample volumes accurate measurement of the actual amount of coal is obtained when properly calibrated.

The device of the present invention contemplates periodic testing of the coal. Assume that such testing is carried out by EMR and NMR equipment utilizing separate magnet systems for the EMR and NMR testing. Assume further that a single type of coal is supplied, as for instance, sample number 3 from Table 1. For that particular sample, data of the sort shown in Table 2 can be obtained from laboratory assay and input to memory. Assume further that the coal is flowing past the two sets of test equipment (referring to the EMR and NMR equipment) and each obtains data at one second intervals. Over a one minute period, sixty data points are obtained for the amplitude of the NMR component from the hydrogen in the coal. This is the term H in Equation (4). In like fashion, the EMR signal response obtains sixty data points. The data is the value for the term C in Equation (4) and is obtained from the EMR signal amplitude multiplied by the signal line width. If desired, the sixty data points for both values can be taken and averaged; the averages can then be used in Equation (4). Alternatively, Equation (4) can be run for every second's data to provide repeated calculations of BTU. Again, it will be noted that scale factors are incorporated which translate to BTU or calories, and these can also be expressed in terms of flow rate.

It should be noted that practicalities require some spacing from the EMR and NMR magnets. This poses no particular problem in view of the dynamics of coal flow. At a given instant, the data obtained for the term H will not coincide precisely with the data obtained for the term C in Equation (4). That is, the coal which is within the NMR test coil is not precisely the same as the coal that is precisely within the EMR test coil. This does not pose any great problem; the flow of data from one or the other can be delayed so that the two sets of data can be matched to take into account the time delay required for the coal to travel from one test coil to the other test coil. Inasmuch as coal is from the same type or batch (see Table 1), no great inconvenience arises from not relatively time shifting the two streams of data to achieve coincidence and thereby avoid the delay of transit time in the pipe.

The velocity of the coal in the pipe may be helpful in the shifting the H and C data streams flowing from the test equipment and is essential to measuring the coal flow rate. By knowledge of the density of the flowing coal as obtained by use of the NMR and EMR data and of the flow velocity the flow rate may be obtained as a product of the two—density and velocity. Velocity may be obtained by use of NMR and other methods as are well known. However, improved velocity measurements can be obtained by the apparatus described in co-pending application Ser. No. 491,168 filed on May 5, 1983. That disclosure sets out a system for measuring the velocity of the coal flow. In addition, it discloses a system for measuring the fill factor or density. It is more of less accurate to say that the pipe passing through the test equipment is full; in actuality, there may be a flowing fluid (air or water) which fills the pipe, but that fluid is not important to the measurement in question. The tested volume of the pipe is not completely coal and hence, that factor is labelled the fill factor or density. The same disclosure sets forth a method and apparatus for determining the fill factor or density.

Heat content measurements Q provides a measure of the heat content of the coal within the sensor volume. This signal can be converted into BTU per pound or to flow in BTU per hour, by use of the flow velocity and the density measured by the NMR and EMR data. The BTU per hour flow data can be integrated over a period of time to provide an indication of the total BTU in the coal delivered through the flow stream over that period of time. This is indicated in the drawings where the output connects to a time rate integrator.

The foregoing is directed to the preferred embodiment, the scope is determined by the claims which follow.

TABLE 1

| SAMPLE NUMBER | STATE - COAL FORMATION | APPARENT RANK | MOISTURE BY WEIGHT PERCENT | PROXIMATE ANALYSIS (DRY) | | | |
|---|---|---|---|---|---|---|---|
| | | | | CALORIFIC VALUE | ASH | VOLATILES | FIXED CARBON |
| 1 | Pennsylvania - Pottsville | AN | 1.29 | 14761 | 5.80 | 7.39 | 86.81 |
| 2 | West Virginia - Allegheny | HVA | 0.58 | 14474 | 9.39 | 48.83 | 41.79 |
| 3 | West Virginia - Pottsville | Med. Vol. | 1.27 | 14048 | 8.69 | 28.50 | 62.81 |
| 4 | Illinois - Kewanee | HVC | 15.90 | 11501 | 11.06 | 40.64 | 48.30 |
| 5 | Ohio - Monongahela | HVA | 3.57 | 10243 | 29.26 | 31.97 | 38.77 |

TABLE 2

| Sample Number | Electron EMR | Hydrogen NMR | $T_2$ | $T_2H_2O$ |
|---|---|---|---|---|
| 10 | 100 | 100 | 70 | 400 |
| 11 | 75 | 88 | 50 | 400 |
| 12 | 39 | 70 | 55 | 400 |
| 13 | 37 | 64 | 60 | 400 |

What is claimed is:

1. A method of measuring the heat content of coal comprising the steps of:
    (a) measuring the nuclear magnetic resonance (NMR) response of hydrogen in the coal;
    (b) measuring the electron magnetic resonance (EMR) of free electrons in the coal; and
    (c) determining the heat content of the coal as a function of the hydrogen NMR and the EMR measurements wherein the step of determining includes the step of comparing with a standard value derived from a known coal assay.

2. The method of claim 1 wherein the step of determining the heat content includes the steps of comparing the measured values of hydrogen in the coal with values dependent on the type of coal and determining the heat content in proportion to the value dependent on the type of coal, which value is from the known coal assay.

3. The method of claim 1 including the step of repetitively obtaining measurements from continuously flowing coal passing through a magnetic field of specified intensity.

4. The method of claim 1 including the step of impressing first and second separate magnetic fields on the coal.

5. The method of claim 1 including the step of forming a magnetic field of specified intensity on the coal, and then interrogating the coal with an RF field;
    detecting a RF signal from the coal in the magnetic field and the RF field; and
    obtaining an output from the detected RF signal encoding a measurement therein.

6. The method of claim 5 wherein free electrons from the coal form the RF signal detected and the signal encodes free electron population in an output signal.

7. The method of claim 6 including the step of converting the output signal by multiplying the resonance line width by amplitude and then taking the product thereof.

8. The method of claim 1 wherein the heat content is given by $$D = AH + (BC) + D$$

where
- D = heat content
- H = the amplitude of NMR signal from hydrogen in the coal;
- C = the EMR signal amplitude times resonance line width of the EMR signal from the coal; and
- A, B and D = constants.

9. The method of claim 1 wherein the step of measuring related to hydrogen includes measuring the free induction decay of hydrogen in volatile compounds in the coal.

10. The method of claim 1 wherein the step of measuring the free electrons comprises the step of
   (a) placing a magnetic field on the coal wherein the field has a fixed intensity;
   (b) forming an RF field at right angles to the magnetic field at a frequency related to the magnetic field intensity and the RF field has a specified duration; and
   (c) detecting with an RF coil an electron magnetic resonance response from the free electrons wherein the response integrates proportionate to free electron population.

11. The method of claim 10 further including the step of obtaining the log of the free electron response integral.

12. The method of claim 1 including the further step of multiplying the log by a constant to define the carbon content of the coal.

13. The method of claim 1 including the step of multiplying the heat content so obtained by the flow velocity of the coal to define the time rate at which the heating value is being delivered in a coal flow system.

14. The method of claim 1 including the step of multiplying the heat content per unit weight by the density of the coal to define the flow rate of coal in a coal flow system.

15. The method of claim 1 including the step of positioning a non-magnetic flow containing conduit for confining a flow stream of coal;
   placing a first magnet adjacent to the conduit to form a specified magnetic field across the conduit; and
   forming a right angle RF field in the conduit, the RF field and the magnetic field interacting in a resonant relationship to create an emitted RF signal indicative of the elemental population in the interacted fields.

16. The method of claim 15 including the step of measuring the amplitude of the RF signal.

17. The method of claim 15 including the step of positioning a second magnet adjacent to the conduit to form a second magnetic field across the conduit, and forming a second RF field in the conduit at right angles to the second magnetic field;
   causing the second RF field to interact with the second magnetic field in a resonant relationship to create an emitted RF signal indicative of the elemental population; and
   wherein said first RF signal is indicative of the free electron population of the coal and the second RF signal is indicative of hydrogen population of volatile compounds of the coal.

18. Apparatus for measuring heat content of coal, comprising:
   (a) magnet means for forming a magnetic field of specified intensity acting on a coal sample;
   (b) first RF field forming means forming a right angle RF field to the magnetic field;
   (c) second RF field forming means forming a right angle RF field to the magnetic field;
   (d) detector means responsive to RF output signals emitted from the coal, therebeing emitted first and second RF signals from the coal;
   (e) output means responsive to said detected first and second RF signals to form a calorific output for the coal; and
   (f) wherein the first and second said RF fields elicit a NMR signal from hydrogen in the coal and an EMR signal from unpaired electrons in the coal, respectively.

19. The method of claim 13 including time rate integrating heat content to indicate the total heat content of the coal flowing over a period of time.

20. The method of measuring the density of the primary combustible part of coal in a conduit comprising the steps of:
   (a) measuring the NMR response of hydrogen in the coal;
   (b) measuring the EMR of free electrons in the coal; and
   (c) determining the concentration of the coal as a function of the hydrogen NMR and EMR free electron population value wherein the step of determining includes comparing with a standard value derived from a known coal assay.

21. The method of claim 20 including the step of multiplying the coal density so obtained by the flow velocity of the coal to define the rate of flow of the primary combustible part of the coal.

22. The method of claim 20 including the step of adding a measure of the density of coal constituents not measured by hydrogen NMR or EMR such as ash and sulfur to provide an indication of the total density of coal within the sensed region of the conduit.

23. The method of claim 21 wherein the flow velocity is obtained by the NMR or EMR measurement.

24. The method of claim 21 wherein the rate of flow so obtained is time integrated to measure the total mass flow over a period of time of the primary combustible part of the coal.

25. The method of claim 20 wherein the hydrogen NMR signal is separated into components based on T1 and T2 decay times to separately measure the proportional amounts of hydrogen in the volatile part of the coal and that in the water in the coal.

26. The method of claim 25 wherein the amount of hydrogen so measured in the volatiles in the coal is multiplied by a factor to provide a measure of the volatile content of the coal.

27. The method of claim 25 wherein the amount of hydrogen so measured in the water in the coal is used to provide a measure of the moisture content of the coal.

28. The method of claim 20 wherein the EMR signal so measured from the free electron in the coal is multiplied by a factor to provide a measure of the carbon content of the coal.

29. Apparatus for measuring the density of coal in a conduit comprising:
   (a) magnet means forming a magnetic field of specified intensity acting on a coal sample;
   (b) first RF field forming means forming a right angle RF field to the magnetic field;
   (c) second RF field forming means forming a right angle RF field to the magnetic field;
   (d) detector means responsive to RF output signals emitted from the coal, therebeing emitted first and second RF signals frm the coal;
   (e) output means responsive to said detector first and second RF signals to form a density measure for the coal in the said RF fields; and
   (f) wherein the first and second said RF fields elicit a NMR signal from hydrogen in the coal and an EMR signal from free electrons in the coal, respectively.

30. The apparatus of claim 29 wherein the first and second said RF Fields elicit a NMR signal from hydrogen in the coal and an EMR signal from unpaired electrons in the coal, respectively.

31. The apparatus of claim 18 wherein the first and second said RF fields elicite a NMR signal from hydrogen in the coal and an EMR signal from unpaired electrons in the coal, respectively.

32. The apparatus of claim 29 including means for multiplying the coal density so obtained by the flow velocity of the coal to define the rate of flow of the primary combustible part of the coal.

33. The apparatus of claim 29 including means for adding a measure of the density of coal constituents not measured by hydrogen NMR or EMR such as ash and sulfur to provide an indication of the total density of coal within the sensed region of the conduit.

34. The apparatus of claim 32 including means for obtaining flow velocity from the resonance measurements.

35. The apparatus of claim 32 including time integrator means to provide as an output a measure of the total mass flow over a period of time of the primary combustible part of the coal.

36. The apparatus of claim 29, including means to separate the hydrogen NMR signal into components based on $T_1$ and $T_2$ decay times to separately measure the proportional amount of hydrogen in the volatile part of the coal and in the water in the coal.

37. The apparatus of claim 36 including means to relate the hydrogen signal so measured from the volatiles to the volatile content of the coal.

38. The apparatus of claim 36 including means to relate the hydrogen signal so measured from the water to the moisture content of the coal.

39. The apparatus of claim 30 including means to relate the EMR signal so measured to the carbon content of the coal.

40. A method of measuring heat content of coal comprising the steps of:
   (a) measuring the nuclear magnetic resonance (NMR) response of hydrogen in the coal;
   (b) measuring the electro-magnetic resonance (EMR) response of unpaired electrons in the coal;
   (c) scaling the magnitude of the NMR response to provide a signal, H, proportional to the available heat content of the hydrogen in the coal determined from a known coal assay;
   (d) scaling the magnitude of the EMR response to provide a signal, C, proportional to the available heat content of the carbon in the coal as determined from a known coal assay;
   (e) obtaining a signal of constant magnitude, D, to account for the loss or gain of additional heat from the remainder of the coal as determined from the known coal assay; and
   (f) using the signals, H, C and D to provide a signal proportional to the heat content of the coal.

41. The method of claim 40 including the step of repetitively obtaining measurements from continuously flowing coal passing through a magnetic field of specified intensity.

42. The method of claim 40 including the step of impressing first and second separate magnetic fields on the coal.

43. The method of claim 40 including the step of forming a magnetic field of specified intensity on the coal, and then interrogating the coal with a RF field;
   detecting a RF signal from the coal in the magnetic field and the RF field; and
   obtaining an output from the detected RF signal encoding a measurement therein.

44. The method of claim 40 wherein unpaired electrons from the coal form the RF signal detected and the signal encodes unpaired electron population in an output signal.

45. The method of claim 40 wherein the step of measuring the free electrons comprises the step of:
   (a) placing a magnetic field on the coal wherein the field has a fixed intensity;
   (b) forming an RF field at right angles to the magnetic field at a frequency related to the magnetic field intensity and the RF field has a specified duration; and
   (c) detecting with an RF coil an electron magnetic resonance response from the free electrons wherein the response integrates proportionate to free electron population.

* * * * *